United States Patent
Wu et al.

(10) Patent No.: US 12,550,681 B2
(45) Date of Patent: Feb. 10, 2026

(54) STANDBY CURRENT DETECTION CIRCUIT

(71) Applicant: Winbond Electronics Corp., Taichung (TW)

(72) Inventors: Bo-Lun Wu, Taichung (TW); Tse-Mian Kuo, New Taipei (TW); Po-Yen Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 391 days.

(21) Appl. No.: 18/334,351

(22) Filed: Jun. 13, 2023

(65) Prior Publication Data

US 2024/0395635 A1 Nov. 28, 2024

(30) Foreign Application Priority Data

May 23, 2023 (TW) .................................. 112119057

(51) Int. Cl.
*H01L 21/66* (2006.01)
(52) U.S. Cl.
CPC .............. *H01L 22/14* (2013.01); *H01L 22/34* (2013.01)
(58) Field of Classification Search
CPC .............. G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 9,230,871 B1 * | 1/2016 | Wang | ...................... H01L 22/34 |
| 10,605,855 B2 | 3/2020 | Wang et al. | |
| 10,756,711 B1 * | 8/2020 | Majumdar | ............. H03K 3/017 |
| 2018/0308773 A1 | 10/2018 | Lee et al. | |

FOREIGN PATENT DOCUMENTS

| | | |
|---|---|---|
| CN | 113092977 | 7/2021 |
| JP | 2006038645 | 2/2006 |
| TW | 200530593 | 9/2005 |
| TW | 200731442 | 8/2007 |
| TW | 201628013 | 8/2016 |
| TW | 1642949 | 12/2018 |
| TW | 202122807 | 6/2021 |
| TW | 202244517 | 11/2022 |

OTHER PUBLICATIONS

"Office Action of Taiwan Counterpart Application", issued on Feb. 27, 2024, p. 1-p. 7.

* cited by examiner

*Primary Examiner* — Tung X Nguyen
(74) *Attorney, Agent, or Firm* — JCIPRNET

(57) ABSTRACT

A standby current detection circuit includes multiple first transistors. The first transistors are coupled in series to form a first detection circuit string, where N is a positive integer. The first detection circuit string is disposed on a scribe lane of a wafer, and the first detection circuit string is operated in a standby state and serves as a test medium for a standby current.

15 Claims, 4 Drawing Sheets

STANDBY CURRENT DETECTION CIRCUIT

CROSS-REFERENCE TO RELATED APPLICATION

This application claims the priority benefit of Taiwan application serial no. 112119057, filed on May 23, 2023. The entirety of the above-mentioned patent application is hereby incorporated by reference herein and made a part of this specification.

BACKGROUND

Technical Field

The invention relates to a standby current detection circuit, and more particularly, to a standby current detection circuit providing a standby current test operation.

Description of Related Art

A problem of standby currents exists in various types of electronic products. However, in the conventional technology, a standby current test operation of various types of chips is performed only during a chip probe (CP) test of a wafer. Namely, under such conditions, the problem of the standby currents of the chips may only be detected after the chips are produced. Since the standby current is often an important factor for a chip yield rate, such a situation may prevent the chip yield rate from being improved quickly, and cause troubles in a design and production process.

SUMMARY

The invention provides a standby current detection circuit, in which in a wafer acceptable test (WAT), a first detection circuit operates in a standby state and provides a test medium for a standby current.

A standby current detection circuit in the invention includes N first transistors. The first transistors are coupled in series to form a first detection circuit string, where N is a positive integer greater than 1. The first detection circuit string is disposed on a scribe lane of a wafer, and the first detection circuit string is operated in a standby state and serves as a test medium for a standby current.

Based on the above, the standby current detection circuit of the invention is disposed on the scribe lane of the wafer, and has one or a plurality of detection circuit strings. The detection circuit string is formed by connecting a plurality of transistors in series. The detection circuit string is set to operate in the standby state, and is used as a test medium for the standby current in the wafer acceptable test (WAT), and is used for early detection of a standby current state of circuit in the chip before the chip probe test of the wafer.

DESCRIPTION OF THE EMBODIMENTS

Figure 1:
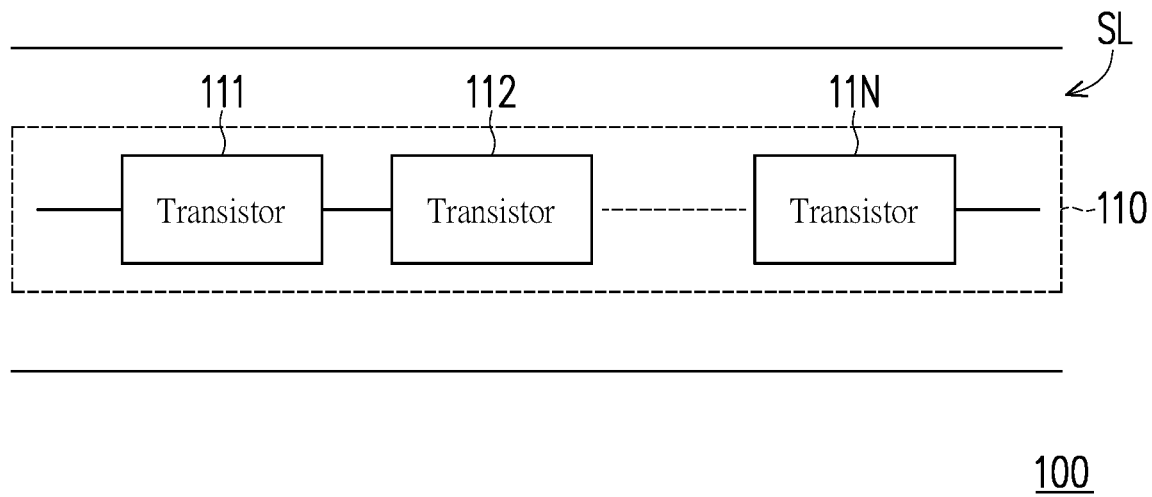
FIG. 1 is a schematic diagram of a standby current detection circuit according to an embodiment of the invention.

Referring to FIG. 1, FIG. 1 is a schematic diagram of a standby current detection circuit according to an embodiment of the invention. A standby current detection circuit 100 is provided on a scribe lane SL of a wafer. The standby current detection circuit 100 includes a detection circuit string 110. Where, the detection circuit string 110 includes a plurality of transistors 111-11N. The transistors 111-11N are coupled in series to form a transistor string. In the embodiment, the standby current detection circuit 100 is configured to provide a test medium for a standby current during a wafer acceptable test (WAT) performed on the wafer. Specifically, in the WAT, a test machine may apply a signal corresponding to a standby current test to a plurality of bonding pads on the detection circuit string 110 in a chip probe manner, so that the detection circuit string 110 may operate in a standby mode. In this way, the test machine may measure the standby current of the detection circuit string 110 in the standby state.

In the embodiment, conductivity types of the transistors 111-11N may be all the same. For example, the transistors 111-11N may all be N-type transistors, or the transistors 111-11N may all be P-type transistors. Channel sizes of the transistors 111-11N may be all the same, partly the same, or all different. In the embodiment, in order to increase diversity of the detected transistors 111-11N, multiple transistors 111-11N with different channel sizes may be arranged in the single detection circuit string 110. For example, the channel sizes of the transistors 111-11N may be a geometric sequence. For example, channel width-to-length ratios of the transistors 111-11N may be $1:2:4:8: \ldots :2^{N-1}$.

By the way, in other embodiments of the invention, the standby current detection circuit 100 may include a plurality of detection circuit strings. Where, different detection circuit strings may have transistors of different conductive types, different numbers of transistors, and/or different configuration relationships of transistor channel sizes. In the implementation of multiple detection circuit strings, the arrangement of the multiple detection circuit strings may be set according to circuit configurations in various chips with different functional specifications. Through the standby current test for all of the detection circuit strings in the WAT, it may provide relevant parameters of the standby current for when designing chips with corresponding functional specifications, and improve working efficiency of the design action.

Figure 2:
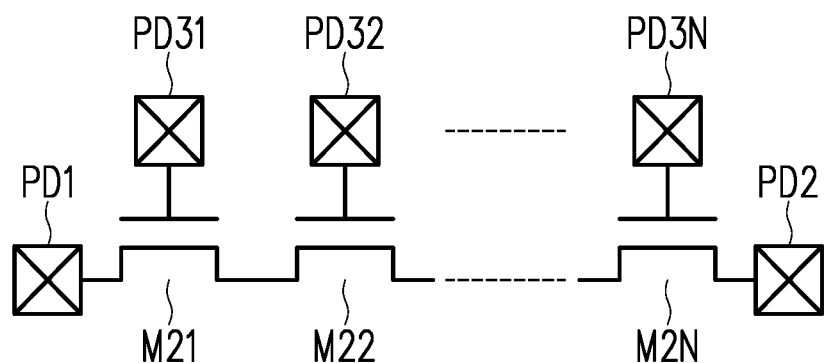
FIG. 2 is a schematic diagram of an implementation of a detection circuit string in a standby current detection circuit according to an embodiment of the invention.

Referring to FIG. 2, FIG. 2 is a schematic diagram of an implementation of a detection circuit string in a standby current detection circuit according to an embodiment of the invention. A detection circuit string 200 includes transistors M21-M2N. The transistors M21-M2N are coupled in series, where a first terminal of the transistor M21 of a first stage may be coupled to a test pad PD1, and a first terminal of the transistor of an intermediate stage (such as the transistor M22 of a second stage) is coupled to a second terminal of the transistor of a previous stage (for example, the transistor M21 of the first stage), a second terminal of the transistor M22 of the second stage may be coupled to a first terminal of the transistor of a next stage. A first terminal of the transistor M2N of the last stage is coupled to a second terminal of the transistor of the previous stage, and a second terminal of the transistor M2N of the last stage is coupled to another test pad PD2.

Moreover, in the embodiment, control terminals of the transistors M21-M2N may be respectively coupled to a plurality of test pads PD31-PD3N. When performing a standby current test operation, the test machine may transmit a plurality of test signals through the test pads PD31-PD3N to individually control a working state of each of the transistors M21-M2N. In addition, the test machine may transmit a test signal through one of the test pads PD1 and PD2, and measure the standby current provided by the detection circuit string 200 through the other one of the test pads PD1 and PD2.

In other embodiments of the invention, the control terminals of the transistors M21-M2N may also be coupled to a common test pad without specific limitations.

In the embodiment, the transistors M21-M2N are all N-type transistors. Channel width-to-length ratios of the transistors M21-M2N may be, for example, 128:256:512: . . . . In some embodiments, at least one of the transistors M21-M2N may be a long channel transistor.

Figure 3:
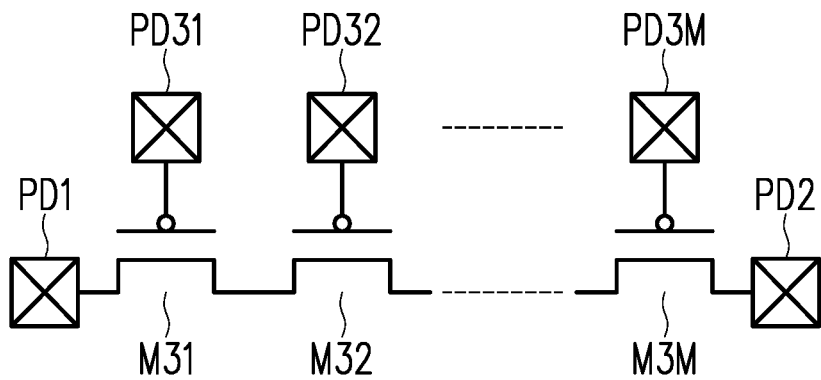
FIG. 3 is a schematic diagram of another implementation of a detection circuit string in a standby current detection circuit according to an embodiment of the invention.

Then, referring to FIG. 3, FIG. 3 is a schematic diagram of another implementation of a detection circuit string in the standby current detection circuit according to an embodiment of the invention. A detection circuit string 300 includes transistors M31-M3M. The transistors M31-M3M are coupled in series with each other. Different from the embodiment shown in FIG. 2, the transistors M31-M3M are all P-type transistors.

Similar to the embodiment shown in FIG. 2, one end of the transistor string formed by the transistors M31-M3M may be coupled to the test pad PD1, and the other end may be coupled to the test pad PD2. Control terminals of the transistors M31-M3M may be coupled to a plurality of test pads PD31-PD3M. Or in other implementations, the control terminals of the transistors M31-M3M may also be coupled to a common test pad. When performing the standby current test operation, the test machine may transmit a test signal through the test pads PD1, PD2, and PD31-PD3M, and make the detection circuit string 300 working in the standby state, thereby performing the standby current test operation.

In the embodiment, channel width-to-length ratios of the transistors M31-M3M may be, for example, 128:256:512: . . . . In some embodiments, at least one of the transistors M31-M3M may be a long-channel transistor.

Figure 4:
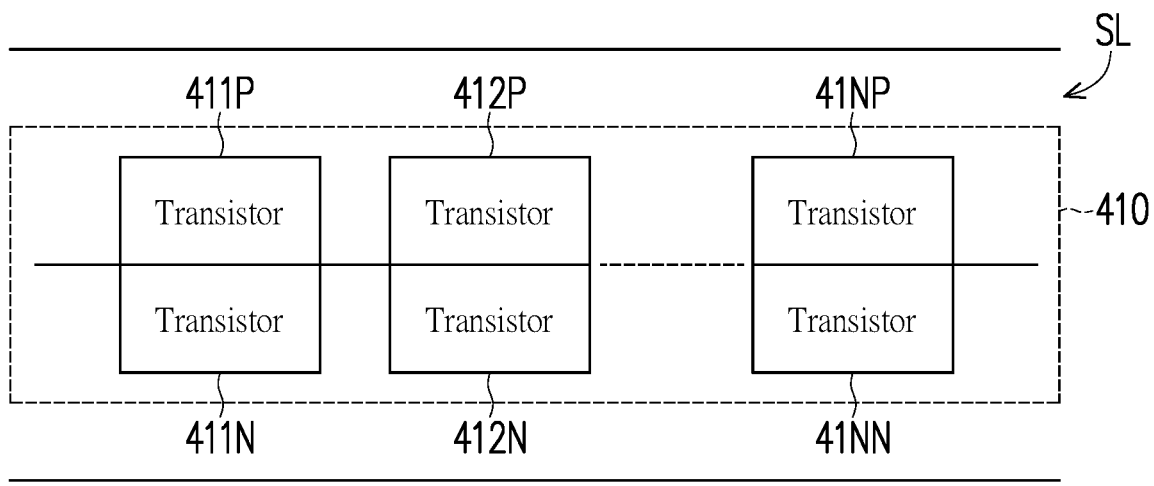
FIG. 4 is a schematic diagram of a standby current detection circuit according to another embodiment of the invention.

Referring to FIG. 4 below, FIG. 4 is a schematic diagram of a standby current detection circuit according to another embodiment of the invention. A standby current detection circuit 400 is provided on a scribe lane SL of a wafer. The standby current detection circuit 400 includes a detection circuit string 410. Where, the detection circuit string 410 includes a plurality of transistors 411P-41NP and corresponding transistors 411N-41NN. The transistors 411P-41NP are respectively coupled to the transistors 411N-41NN, and respectively form a plurality of transistor pairs. The plurality of transistor pairs are coupled in series to form a series of transistor pairs.

In the embodiment, the transistors 411P-41NP may all be P-type transistors, and the transistors 411N-41NN may all be N-type transistors. Accordingly, each transistor pair may form a complementary metal-oxide-semiconductor (CMOS).

It should be noted that channel sizes of the transistors 411P-41NP may be all the same, partly the same, or all different. The channel sizes of the transistors 411N-41NN may also be all the same, partly the same, or all different. Moreover, the channel size of each of the transistors 411P-41NP may or may not be related to a channel size of the corresponding one of the transistors 411N-41NN. Specifically, the channel sizes of the transistors 411P-41NP may be a geometric sequence with a common ratio of 2, and the channel sizes of the transistors 411N-41NN may present the same geometric sequence; the channel sizes of the transistors 411N-41NN may also be is a geometric sequence with a common ratio of 1/2; or, the channel sizes of the transistors 411N-41NN may also be the same, which is not specifically limited.

The same as the previous embodiment, when performing the standby current test operation, the test machine may make the standby current detection circuit 400 operating in the standby state, thereby measuring the standby current of the standby current detection circuit 400.

It should be noted that the definition of the standby state may be the same as that defined in the functional circuit corresponding to the standby current detection circuit 400. In the embodiment, in the standby state, the transistors 411P-41NP may be all in a turn-off state, or the transistors 411N-41NN may be all in the turn-off state. Alternatively, in the standby state, the transistors 411P-41NP-411P-41NPP may be all in the turn-off state.

Figure 5:
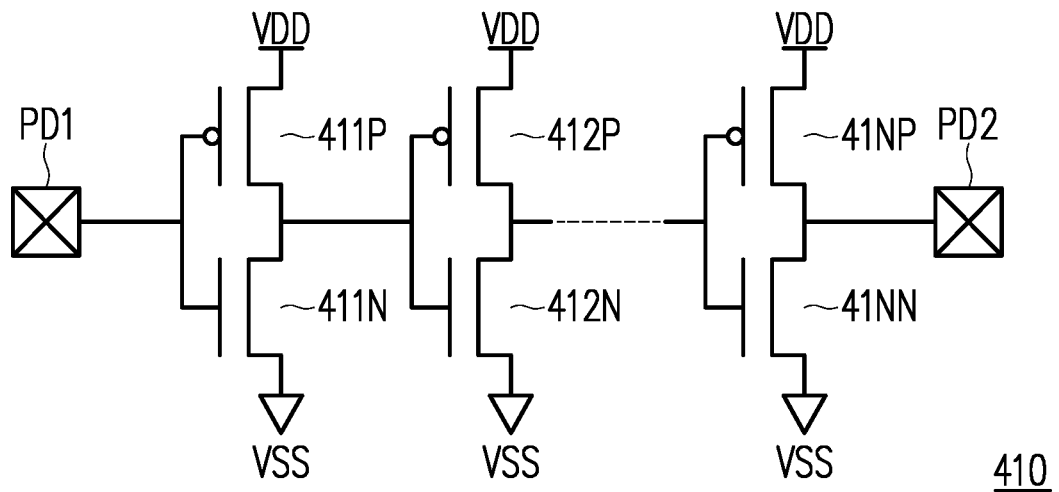
FIG. 5 is a schematic diagram of an implementation of the standby current detection circuit according to the embodiment of FIG. 4.

Referring to FIG. 5 below, FIG. 5 is a schematic diagram of an implementation of the standby current detection circuit according to the embodiment of FIG. 4. In FIG. 5, the transistors 411P and 411N are coupled to each other to form an inverter; the transistors 412P and 412N are coupled to form another inverter; . . . ; the transistors 41NP and 41NN are coupled to form an inverter of an $N^{th}$ group, where the N inverters may be coupled in series with each other.

In detail, take the inverter composed of the transistors 411P and 411N as an example, a first terminal of the transistor 411P receives a power supply voltage VDD; a second terminal of the transistor 411P is coupled to a first terminal of the transistor 411N; a control terminal of the transistor 411P is coupled to a control terminal of the transistor 411N, and is coupled to the test pad PD1; and a second terminal of the transistor 411N receives a reference ground voltage VSS. In addition, between the adjacent inverters, an output terminal of the inverter may be coupled to an input terminal of a next-stage inverter, and an output terminal of the last-stage inverter may be coupled to the test pad PD2.

Figure 6:
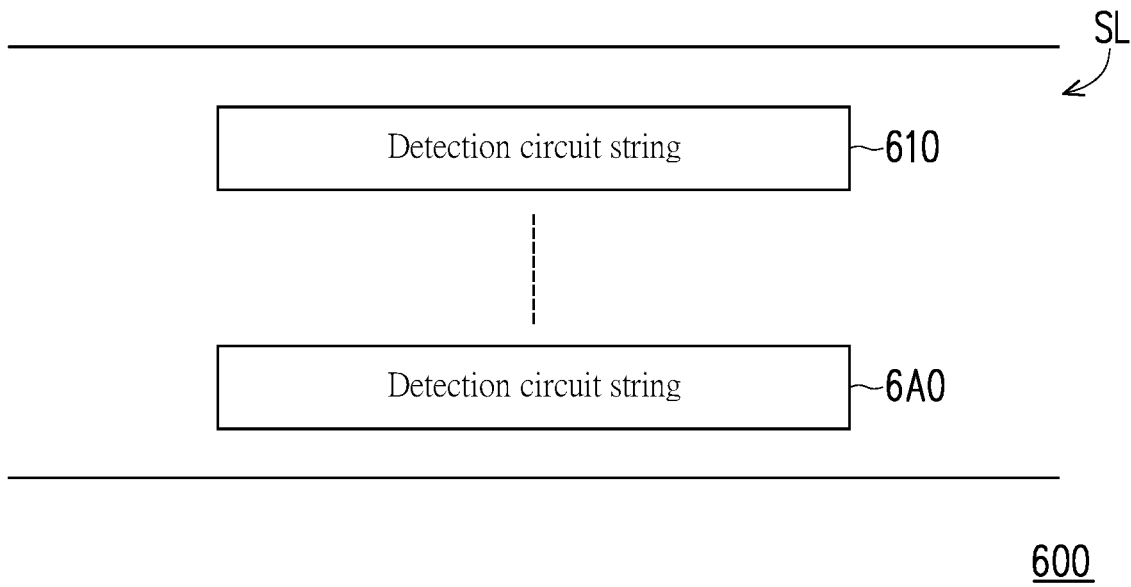
FIG. 6 is a schematic diagram of a standby current detection circuit according to another embodiment of the invention.

Referring to FIG. 6 below, FIG. 6 is a schematic diagram of a standby current detection circuit according to another embodiment of the invention. A standby current detection circuit 600 is disposed in a scribe lane SL of a wafer. The standby current detection circuit 600 includes a plurality of detection circuit strings 610-6A0. Each of the detection circuit strings 610-6A0 may be implemented by any one of the detection circuit strings 110, 200, 300, 410 in the aforementioned embodiments. Moreover, the transistors in one of the detection circuit strings 610-6A0 (such as the detection circuit string 610) may have a first voltage tolerance; the transistors in the other one of the detection circuit strings 610-6A0 (such as the detection circuit string 620)

may have a second voltage tolerance. Where, the first voltage tolerance may be lower than the second voltage tolerance.

In the embodiment, the standby current detection circuit 600 includes a sufficient number of the detection circuit strings 610-6A0, which respectively correspond to multiple possibilities of the functional chips in practical applications. In this way, by performing a standby current test operation on the standby current detection circuit 600 during a wafer acceptance process, relevant information about the state of the standby current that may be generated by each functional chip in the actual circuit design may be obtained in advance, which may be of sufficient help in parameter adjustment operations of subsequent design and manufacturing of the functional chips.

Figure 7A:
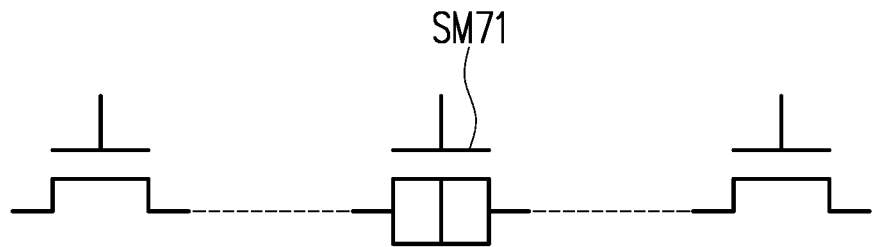
FIG. 7A and FIG. 7B are respectively schematic diagrams of different implementations of a detection circuit string of a standby current detection circuit according to an embodiment of the invention.
Figure 7B:
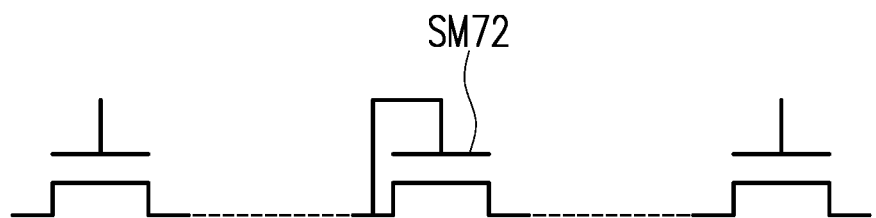

Referring to FIG. 7A and FIG. 7B below, FIG. 7A and FIG. 7B are respectively schematic diagrams of different implementations of a detection circuit string of a standby current detection circuit according to an embodiment of the invention. In FIG. 7A, a detection circuit string 710 includes a plurality of transistors coupled in series with each other. Where, at least one selected transistor SM71 in the detection circuit string 710 may be coupled to form a capacitive configuration. In detail, a first terminal (for example, a source), a second terminal (for example, a drain) and a substrate of the selected transistor SM71 are coupled to each other. Where, the detection circuit string 710 may have one or a plurality of selected transistors SM71, and the number thereof is not specifically limited.

In addition, in FIG. 7B, a detection circuit string 720 also includes a plurality of transistors coupled in series. Where, at least one selected transistor SM72 in the detection circuit string 720 may be coupled to form a diode configuration. In detail, a first terminal (such as a source or a drain) of the selected transistor SM72 may be coupled with a control terminal (such as a gate) to form a diode. Where, the detection circuit string 720 may have one or a plurality of selected transistors SM72, and the number thereof is not specifically limited.

It should be noted that, in the embodiment of the invention, the detection circuit string may have at least one selected transistor for coupling into a capacitor, and have at least one selected transistor for coupling into a diode. Namely, the plurality of transistors in a single detection circuit string may respectively have various coupling configurations.

In summary, the invention arranges a standby current detection circuit on the scribe lane of the wafer, and by making the detection circuit string in the standby current detection circuit operating in the standby state, a standby current state of the circuit in the chip may be detected during the wafer acceptable test of an early test, by which component characteristics of the circuit components in the wafer may be effectively learned in advance, thereby effectively improving the parameter adjustment operations in subsequent design and manufacturing, and accelerating a design and manufacturing speed of the functional chips.

What is claimed is:

1. A standby current detection circuit, comprising:
   at least one first detection circuit string comprising N first transistors, wherein the first transistors are coupled in series to form the at least one first detection circuit string, and N is a positive integer greater than 1,
   wherein the at least one first detection circuit string is disposed on a scribe lane of a wafer, and the first detection circuit string is operated in a standby state and serves as a test medium for a standby current,
   wherein a first terminal of the first transistor of a first stage is coupled to a first test pad, a first terminal of the first transistor of an $i^{th}$ stage is coupled to a second terminal of the first transistor of an $(i-1)^{th}$ stage, control terminals of the first transistors are respectively coupled to a plurality of second test pads, and the second terminal of the first transistor of a last stage is coupled to a third test pad, wherein i is an integer greater than 1 and less than N+1.

2. The standby current detection circuit according to claim 1, wherein conductivity types of the first transistors are all the same.

3. The standby current detection circuit according to claim 1, wherein channel sizes of the first transistors are partly the same, all the same, or all different.

4. The standby current detection circuit according to claim 1, wherein channel sizes of the first transistors are in a geometric sequence.

5. The standby current detection circuit according to claim 1, wherein the first detection circuit further comprises:
   N second transistors respectively coupled to the first transistors, wherein conductivity types of the second transistors are all the same, and the conductivity types of the second transistors are complementary to conductivity types of the first transistors.

6. The standby current detection circuit according to claim 5, wherein a first terminal of each of the second transistors is coupled to a second terminal of each of the corresponding first transistors, a second terminal of each of the second transistors receives a reference ground voltage, a control terminal of each of the second transistors is coupled to a control terminal of each of the corresponding first transistors, and first terminals of the first transistors receive a power supply voltage.

7. The standby current detection circuit according to claim 5, wherein channel sizes of the second transistors are partly the same, all the same, or all different.

8. The standby current detection circuit according to claim 5, wherein channel sizes of the second transistors are in a geometric sequence.

9. The standby current detection circuit according to claim 5, further comprising:
   at least one second detection circuit string comprising M third transistors, wherein the third transistors are coupled in series to form the at least one second detection circuit string, and M is a positive integer greater than 1,
   wherein the at least one second detection circuit string is disposed on the scribe lane of the wafer, and operated in the standby state and serves as the test medium for the standby current.

10. The standby current detection circuit according to claim 9, wherein a voltage tolerance of the third transistors is different from a voltage tolerance of the first transistors.

11. The standby current detection circuit according to claim 9, wherein the second detection circuit string further comprises:
   M fourth transistors respectively coupled to the third transistors, wherein conductivity types of the fourth transistors are all the same, and the conductivity types of the fourth transistors are complementary to the conductivity types of the third transistors.

12. The standby current detection circuit according to claim 1, wherein at least one selected transistor in each of the first transistors is coupled to form a capacitive configuration.

13. The standby current detection circuit according to claim 1, wherein at least one selected transistor in each of the first transistors is coupled to form a diode configuration.

14. The standby current detection circuit according to claim 1, wherein at least one selected transistor in each of the first transistors is a long channel transistor.

15. The standby current detection circuit according to claim 1, wherein the first transistors are connected to each other through at least one metal wire formed by a wire layer.

* * * * *